United States Patent
Xi et al.

(10) Patent No.: US 9,344,102 B2
(45) Date of Patent: May 17, 2016

(54) THRESHOLD CORRECTION METHOD FOR MULTI-VOLTAGE THRESHOLD SAMPLING DIGITIZATION DEVICE

(71) Applicant: RAYCAN TECHNOLOGY CO., LTD. (SU ZHOU), Suzhou New District, Suzhou (JP)

(72) Inventors: Daoming Xi, Jiangsu (CN); Qingguo Xie, Jiangsu (CN); Wei Liu, Jiangsu (CN)

(73) Assignee: RAYCAN TECHNOLOGY CO., LTD. (SU ZHOU), Suzhou New District, Suzhou, Jiangsu (CN)

(*) Notice: Subject to any disclaimer, the term of this patent is extended or adjusted under 35 U.S.C. 154(b) by 0 days.

(21) Appl. No.: 14/765,551

(22) PCT Filed: Feb. 28, 2013

(86) PCT No.: PCT/CN2013/072006
§ 371 (c)(1),
(2) Date: Aug. 3, 2015

(87) PCT Pub. No.: WO2014/121530
PCT Pub. Date: Aug. 14, 2014

(65) Prior Publication Data
US 2015/0372689 A1 Dec. 24, 2015

(30) Foreign Application Priority Data
Feb. 5, 2013 (CN) .......................... 2013 1 0045681

(51) Int. Cl.
*H03M 1/06* (2006.01)
*H03M 1/10* (2006.01)
*H03M 1/36* (2006.01)

(52) U.S. Cl.
CPC .............. *H03M 1/06* (2013.01); *H03M 1/1057* (2013.01); *H03M 1/361* (2013.01)

(58) Field of Classification Search
CPC ..... H03M 1/06; H03M 1/361; H03M 1/1057; H03M 1/12; H03M 1/0658; G01C 19/065
USPC .................................................. 341/118–155
See application file for complete search history.

(56) References Cited

U.S. PATENT DOCUMENTS

| | | | |
|---|---|---|---|
| 7,477,301 B2 | 1/2009 | Ikeda | |
| 7,492,834 B2* | 2/2009 | Omori | H04J 14/02 341/176 |
| 7,577,183 B2* | 8/2009 | Nakayama | H04J 13/00 341/132 |
| 7,750,732 B1* | 7/2010 | Delano | H03F 1/0233 330/127 |

(Continued)

*Primary Examiner* — Lam T Mai
(74) *Attorney, Agent, or Firm* — Knobbe Martens Olson & Bear LLP

(57) ABSTRACT

A threshold correction method is for a multi-voltage threshold sampling digitization device. The method includes: generating a triangular wave, and measuring the slope k1 of the rising edge part and the slope k2 of the falling edge part of the waveform of the triangular wave and the peak value amplitude Vpeak thereof, the width DOT of the part of the pulse higher than an actual working threshold Vt being represented as DOT(Vt)=(Vpeak−Vt)/k1−(Vpeak−Vt)/k2; setting n groups of threshold pairs; calculating a threshold under an actual working state using the measured pulse width DOT according to a formula; and establishing a threshold correction function according to a corresponding relationship between actual working state thresholds and reference voltages set practically, and then correcting a set threshold according to the function.

8 Claims, 2 Drawing Sheets

(56) References Cited

U.S. PATENT DOCUMENTS

| | | | | |
|---|---|---|---|---|
| 8,005,134 | B2* | 8/2011 | Yamane | H03K 5/08 341/72 |
| 8,649,471 | B1* | 2/2014 | Charbonneau | H01L 27/2624 341/132 |
| 8,779,952 | B1* | 7/2014 | Zortea | H03M 1/1004 341/118 |
| 2004/0049120 | A1 | 3/2004 | Cao | |
| 2009/0103361 | A1 | 4/2009 | Wang | |
| 2012/0098684 | A1* | 4/2012 | Petigny | H03M 1/1047 341/118 |
| 2012/0229314 | A1* | 9/2012 | Asami | H03M 1/109 341/118 |
| 2012/0293346 | A1* | 11/2012 | Takayama | H03K 5/249 341/110 |
| 2013/0176156 | A1* | 7/2013 | Danjo | H03K 5/249 341/155 |
| 2014/0132437 | A1* | 5/2014 | Danjo | H03M 1/361 341/159 |
| 2014/0152482 | A1* | 6/2014 | Hoshino | H03L 5/00 341/155 |
| 2015/0054665 | A1* | 2/2015 | Ohta | H03M 1/12 341/118 |

* cited by examiner

THRESHOLD CORRECTION METHOD FOR MULTI-VOLTAGE THRESHOLD SAMPLING DIGITIZATION DEVICE

This application is the US national phase of International Application No. PCT/CN2013/072006 filed on Feb. 28, 2013, which claims priority to Chinese patent application No. 201310045681.9 titled "METHOD FOR CORRECTING THRESHOLD OF MULTI-VOLTAGE THRESHOLD SAMPLING DIGITIZATION DEVICE" and filed with the State Intellectual Property Office on Feb. 5, 2013, which are incorporated herein by reference in their entireties.

TECHNICAL FIELD

The present disclosure relates to the field of positron emission tomography equipment, and in particular to a method for correcting a threshold of a multi-voltage threshold sampling digitization device.

BACKGROUND

Positron Emission Tomography (PET) captures gamma photons produced in a human body when a positron is annihilated, and obtains the distribution of a positron nuclide tracer inside the human body, to obtain pathophysiological characteristics such as organ functions and metabolism.

The accuracy of information carried by the gamma photons such as energy, position and time directly affect imaging performance of the system. A critical component of the PET system is the scintillation pulse acquisition and processing unit, whose main functions include processing a scintillation pulse formed by a front detector, to acquire information carried by the gamma photons such as energy, position and time. In order to ensure the performance of the PET system, it is desired that the employed scintillation pulse acquisition and processing unit has such features as high precision, stable performance, real-time correctability, and high integration level.

The Multi-Voltage Threshold (MVT) sampling method is an inexpensive and efficient solution to digitalize a scintillation pulse from a nuclear medicine apparatus such as PET. The method uses a plurality of voltage thresholds appropriately determined according to the characteristics of the scintillation pulse, and realizes digitization sampling of the scintillation pulse by digitizing the time at which the scintillation pulse crosses a voltage threshold. MVT digitization devices developed based on the method have been applied to PET systems, and most of the MVT digitization devices are composed of a comparator and a time-to-digital converter. Specifically, the comparator is for comparing the scintillation pulse with voltage thresholds and outputting a hopping signal when the scintillation pulse crosses a voltage threshold; the time-to-digital converter is for digitization sampling the time at which the hopping signal is output by the comparator.

In order to avoid a sampling error resulting from the difference between comparing voltage and actual voltage thresholds due to comparator precision, most existing MVT digitization devices include a high-precision comparator. Using such a high-precision comparator can solve the above issue to a certain extent, but drastically increases the cost of the digitization device as a whole. Moreover, such a high-precision comparator imposes a high requirement on the working environment, and its power consumption is high; hence the cost of the whole MVT digitization device is too expensive and the channel density is low.

Therefore, in view of the problem in the prior art, it is desired to provide a new method for correcting a threshold of a multi-voltage threshold sampling digitization device, to lower the requirement on comparator precision in implementation of the MVT digitization device.

SUMMARY

In view of the above, an object of the present disclosure is to provide a method for correcting a threshold of a multi-voltage threshold sampling digitization device, which acquires a relation between a comparing voltage set to a comparator in the multi-voltage threshold sampling digitization device and a comparing voltage in actual operation, by which the sampling precision of the multi-voltage threshold sampling digitization device can be improved effectively, and the requirement on comparator precision is lowered.

In order to achieve the above object, the present disclosure provides a technical solution as follows.

A method for correcting a threshold of a multi-voltage threshold sampling digitization device, including:

S1: generating a triangle wave for correcting a threshold of a multi-voltage threshold sampling digitization device, measuring k1, k2 and Vpeak of the waveform of the triangle wave, and representing a DOT of the waveform of the triangle wave as:

$$DOT(Vt) = \frac{Vpeak - Vt}{k1} - \frac{Vpeak - Vt}{k2},$$

where k1 is the slope of a rising edge of the waveform of the triangle wave, k2 is the slope of a falling edge of the waveform of the triangle wave, Vpeak is the peak amplitude of the waveform of the triangle wave, Vt is an actual-operation threshold, and DOT(Vt) is the width of a portion of the pulse that is higher than the actual-operation threshold;

S2: configuring a reference voltage for each comparator in the multi-voltage threshold sampling digitization device, and acquiring sampling points of the pulse of S1 by digitization sampling the pulse with the digitization device;

S3: calculating a DOT for each comparator under its set reference voltage based on the sampling points obtained in S2, calculating an actual-operation threshold for each comparator based on the formula given in S1, and establishing a set of correspondence between each calculated actual-operation threshold and the set reference voltage;

S4: reconfiguring the reference voltage for each comparator in the digitization device and repeating S2 and S3 for m times, to obtain, for each comparator in the multi-voltage threshold sampling digitization device, n sets of correspondence between actual-operation thresholds and set reference voltages, where n is a positive integer larger than or equal to 1 and m is a positive integer larger than or equal to 0;

S5: dividing the actual-operation thresholds and their corresponding set reference voltages obtained in S4 into k groups according to the associated comparator, where k is a positive integer and represents the number of comparators in the multi-voltage threshold sampling digitization device;

S6: obtaining, by linear fit, a function relation between the actual-operation thresholds and the set reference voltages for each group of data:

$$y(a,i) = k(a) \times x(a,i) + \text{offset}(a),$$

where y(a,i) represents the actual-operation threshold in the i-th pair corresponding to the a-th comparator in the multi-voltage threshold sampling digitization device, x(a,i) represents the set reference voltage in the i-th pair corresponding to the a-th comparator in the multi-voltage threshold sampling digitization device, and k(a) and offset(a) represent coefficients obtained from the linear fit on the actual-operation thresholds and set reference voltages in the group of data corresponding to the a-th comparator; and S7: obtaining an actual threshold voltage for each comparator under a set reference voltage based on the threshold correction function obtained in S6, and achieving threshold correction.

Preferably, in the above method for correcting a threshold of a multi-voltage threshold sampling digitization device, the DOT in S3 may be calculated by: taking two sampling points that are obtained via the same comparator from the acquired sampling points of the pulse, and calculating the time interval between the two sampling points, the value of the time interval being the DOT of the comparator under an actual-operation threshold voltage corresponding to the set reference voltage of the comparator in this sampling.

Preferably, in the above method for correcting a threshold of a multi-voltage threshold sampling digitization device, the DOT in S3 may be the average of the DOTs obtained from a plurality of times of measurement under the same condition.

Preferably, in the above method for correcting a threshold of a multi-voltage threshold sampling digitization device, the threshold correction function in S6 may have another expression:

$$y(a,i)=x(a,i)+\text{offset}(a),$$

where offset(a) is the difference between the operation threshold and the set reference voltage corresponding to the a-th comparator when n is equal to 1 in S4; and offset(a) is the average of differences between the operation thresholds and set reference voltages in the plurality of pairs corresponding to the a-th comparator when n is larger than 1 in S4.

Preferably, in the above method for correcting a threshold of a multi-voltage threshold sampling digitization device, when n is larger than 2 in S4, the correction function in S6 may be obtained by spline fit or spline interpolation on the operation thresholds and set reference voltages in the plurality of pairs corresponding to the comparator, which are obtained in S4, to obtain a relation between an actual-operation threshold and an actual set reference voltage.

Preferably, in the above method for correcting a threshold of a multi-voltage threshold sampling digitization device, when n is larger than 2 in S4, the correction function in S6 may be obtained by linear interpolation on the operation thresholds and set reference voltages in the plurality of pairs corresponding to the comparator, which are obtained in S4, to obtain a relation between an actual-operation threshold and an actual set reference voltage.

Preferably, in the above method for correcting a threshold of a multi-voltage threshold sampling digitization device, in S7 the threshold correction function or a look-up table is used to configure, for each comparator, a corresponding reference voltage according to a threshold voltage to be set to the comparator.

Preferably, in the above method for correcting a threshold of a multi-voltage threshold sampling digitization device, the triangle wave in S1 may be replaced with a sine wave represented as:

$$y = k \times \sin\left(\frac{t}{T} \times 2\pi\right) + b;\ -0.25T < t < 0.75T.$$

when it is measured that the peak value of the sine wave is 2k, the period of the sine wave is T and the average voltage is b, the DOT where the sine wave is higher than the voltage Vt may be represented as:

$$DOT(Vt) = \frac{\frac{\pi}{2} - \sin^{-1}\left[\frac{Vt-b}{k}\right]}{\pi} \times T.$$

Preferably, in the above method for correcting a threshold of a multi-voltage threshold sampling digitization device, the triangle waveform in S1 may be replaced with any waveform that has a voltage value at time t represented as the following definite mathematical expression:

$$\begin{cases} y = f(t); t > t0 \\ y = V\text{peak}; t = t0, \\ y = g(t); t < t0 \end{cases}$$

where t0 is the time corresponding to the peak voltage Vpeak in the waveform, and the DOT corresponding to the voltage Vt may be represented as:

$$DOT(Vt)=g^{-1}(Vt)-f^{-1}(Vt).$$

Preferably, in the above method for correcting a threshold of a multi-voltage threshold sampling digitization device, the triangle waveform in S1 may be replaced with any waveform, and the relation between Vt and DOT of the waveform may be obtained by measuring DOTs of the pulse under a plurality of voltages and then establishing a look-up table.

As can be seen from the above technical solutions, the method for correcting a threshold of a multi-voltage threshold sampling digitization device according to the present disclosure can effectively solve the problem of sampling precision deterioration due to the inconsistency between the reference voltage actually set in the comparator under actual-operation status and the actual-operation status threshold. By using the method, it is no longer needed to use a high-precision comparator in the MVT device, effectively reducing the cost of the MVT device. Moreover, due to the decrease of comparator precision, power consumption of the device as a whole can be improved effectively and high-density integration is permitted.

Compared with the prior art, the advantages of the present disclosure include:

the method for correcting a threshold of a multi-voltage threshold sampling digitization device according to the present disclosure acquires the relation between a threshold set to the comparator and an actual-operation threshold for threshold correction, thereby avoiding the use of a high-precision comparator in the a high-precision MVT device. The correction function is obtained from a relation between the actual threshold and DOT, the width of a portion of the pulse that is higher than the actual-operation threshold, of a special waveform such as a triangle wave.

BRIEF DESCRIPTION OF THE DRAWINGS

For a clearer illustration of the technical solutions in the embodiments of the present disclosure as well as in the prior art, the accompany drawings used in the description of the embodiments and the prior art will be described briefly. Clearly, the accompany drawings in the following description are only some embodiments of the present disclosure. For those skilled in the art, other accompany drawings can be obtained according to these accompany drawings without inventive effort.

DETAILED DESCRIPTION

The present disclosure discloses a method for correcting a threshold of a multi-voltage threshold sampling digitization device, which can effectively improve the sampling precision of a multi-voltage threshold sampling digitization device and thus lower the requirement on comparator precision by the multi-voltage threshold sampling digitization device.

The technical solutions according to the embodiments of the present disclosure will be described in detail hereinafter in conjunction with the accompany drawings in the embodiments of the present disclosure. Clearly, the embodiments described herein are only some embodiments of the present disclosure. All the other embodiments obtained by those skilled in the art based on the embodiments described herein without inventive effort shall fall within the scope of the present disclosure.

Figure 2:
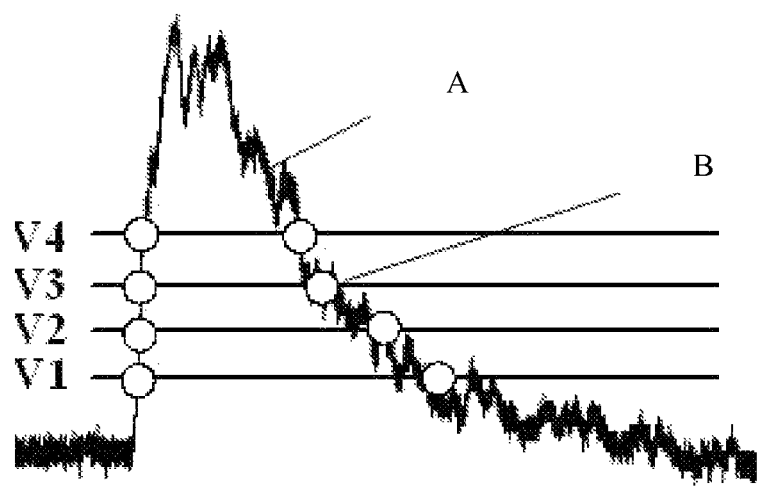
FIG. 2 is a diagram illustrating the basic principle of an MVT sampling method.

FIG. 2 shows the basic principle of an MVT sampling method, in which A represents a scintillation pulse. Four thresholds (the number may also be any other value larger than 1; in all the following cases the number is 4, unless otherwise specified) are set in the figure: V1, V2, V3 and V4. The times at which the pulse crosses these thresholds are identified and converted into digital signals. A comparator is used to identify the time instants at which the pulse crosses these thresholds, and a time-to-digital converter is used to digitize the corresponding time instants. An MVT device having four thresholds generates 8 sampling points, of which 4 are on a rising edge of the pulse and the other 4 are on a falling edge of the pulse. Generally, the implementation of such MVT device requires 4 comparators, each corresponding to a threshold for identifying the time instants at which the pulse goes beyond or below the threshold. Therefore, one comparator corresponds to one threshold and relates to 2 sampling points, one being on the rising edge of the pulse and the other being on the falling edge. In the figure, B represents the time instant at which the pulse goes below the threshold V3, which is identified by the comparator corresponding to the threshold.

Based on the MVT sampling principle, for a pulse, the time interval between two sampling points determined by a comparator represents the width of the pulse that exceeds an actual-operation threshold of the comparator (Duration over threshold, hereinafter referred to as DOT). Actual pulses are continuous and smooth; therefore the DOT described above has a one-to-one correspondence with the actual-operation threshold of the comparator. In the case where shape characteristics of the input pulse is known, the actual-operation threshold of each comparator in the MVT can be calculated according to the measured DOT, thus establishing a relation between the reference voltage set to the comparator and the actual-operation threshold of the comparator, and achieving correction.

Figure 1:
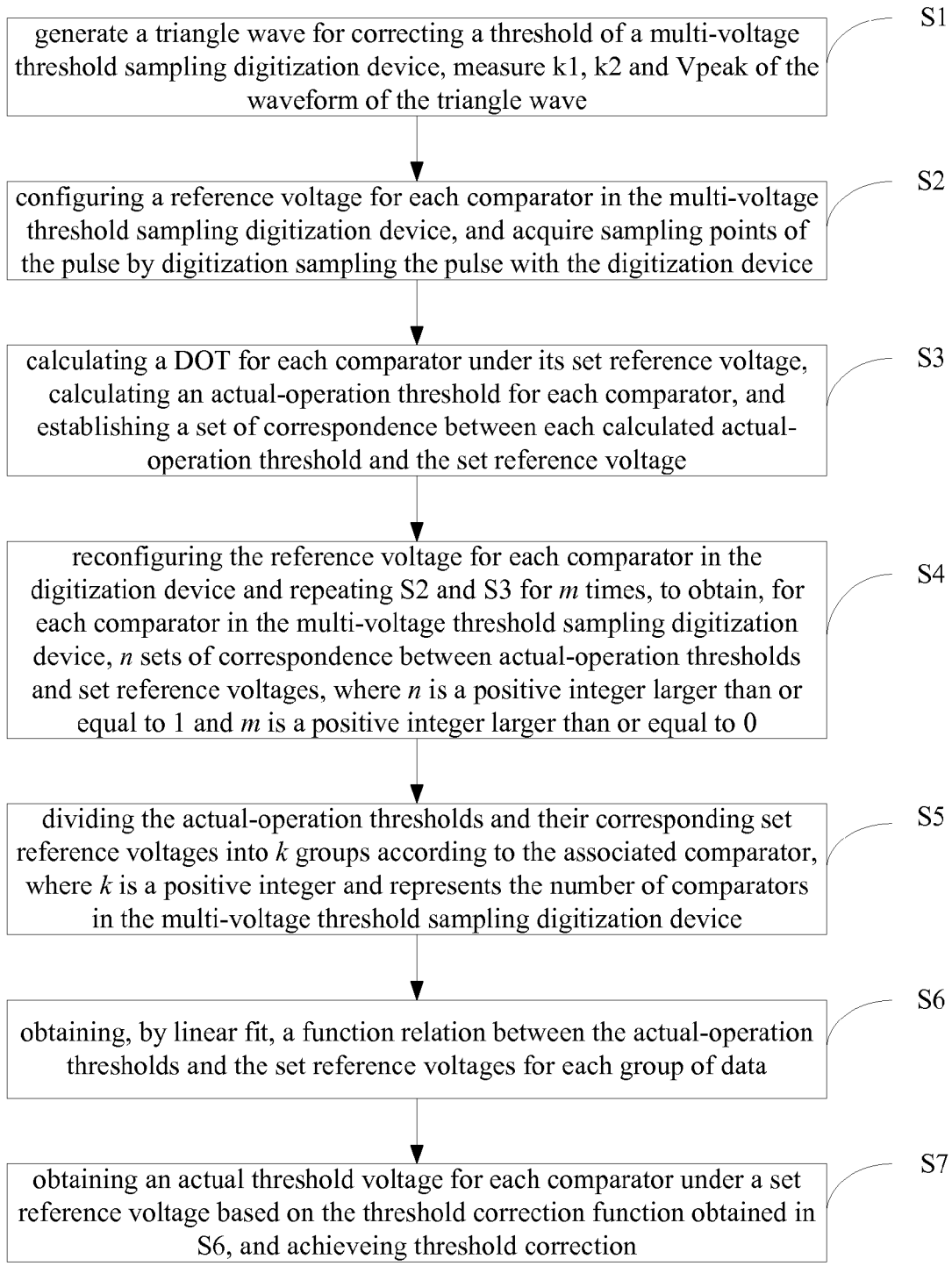
FIG. 1 is a flowchart of a method for correcting a threshold of a multi-voltage threshold sampling digitization device according to the present disclosure.

As shown in FIG. 1, according to the above principle, the method for correcting a threshold of a multi-voltage threshold sampling digitization device includes the steps S1 to S7.

The method for correcting a threshold of a multi-voltage threshold sampling digitization device includes steps S1 to S7.

S1 includes: generating a triangle wave for correcting a threshold of a multi-voltage threshold sampling digitization device, measuring k1, k2 and Vpeak of the waveform of the triangle wave, and representing a DOT of the waveform of the triangle wave as:

$$DOT(Vt) = \frac{Vpeak - Vt}{k1} - \frac{Vpeak - Vt}{k2},$$

where k1 is the slope of a rising edge of the waveform of the triangle wave, k2 is the slope of a falling edge of the waveform of the triangle wave, Vpeak is the peak amplitude of the waveform of the triangle wave, Vt is an actual-operation threshold, and DOT(Vt) is the width of a portion of the pulse that is higher than the actual-operation threshold.

S2 includes: configuring a reference voltage for each comparator in the multi-voltage threshold sampling digitization device, and acquiring sampling points of the pulse of S1 by digitization sampling the pulse with the digitization device.

S3 includes: calculating a DOT for each comparator under its set reference voltage based on the sampling points obtained in S2, calculating an actual-operation threshold for each comparator based on the formula given in S1, and establishing a set of correspondence between each calculated actual-operation threshold and the set reference voltage.

S4 includes: reconfiguring the reference voltage for each comparator in the digitization device and repeating S2 and S3 for m times, to obtain, for each comparator in the multi-voltage threshold sampling digitization device, n sets of correspondence between actual-operation thresholds and set reference voltages, where n is a positive integer larger than or equal to 1 and m is a positive integer larger than or equal to 0.

S5 includes: dividing the actual-operation thresholds and their corresponding set reference voltages obtained in S4 into k groups according to the associated comparator, where k is a positive integer and represents the number of comparators in the multi-voltage threshold sampling digitization device.

S6 includes: obtaining, by linear fit, a function relation between the actual-operation thresholds and the set reference voltages for each group of data:

$$y(a,i) = k(a) \times x(a,i) + offset(a),$$

where y(a,i) represents the actual-operation threshold in the i-th pair corresponding to the a-th comparator in the multi-voltage threshold sampling digitization device, x(a,i) represents the set reference voltage in the i-th pair corresponding to the a-th comparator in the multi-voltage threshold sampling digitization device, and k(a) and offset(a) represent coefficients obtained from the linear fit on the actual-operation thresholds and set reference voltages in the group of data corresponding to the a-th comparator.

S7 includes: obtaining an actual threshold voltage for each comparator under a set reference voltage based on the threshold correction function obtained in S6, and achieving threshold correction.

The DOT in S3 may be calculated by: taking two sampling points that are obtained via the same comparator from the acquired sampling points of the pulse, and calculating the time interval between the two sampling points, the value of the time interval being the DOT of the comparator under an actual-operation threshold voltage corresponding to the set reference voltage of the comparator in this sampling.

The DOT in S3 may be the average of the DOTs obtained from a plurality of times of measurement under the same condition.

The threshold correction function in S6 may have an expression:

$$y(a,i)=x(a,i)+\text{offset}(a),$$

where offset(a) is the difference between the operation threshold and the set reference voltage corresponding to the a-th comparator when n is equal to 1 in S4; and offset(a) is the average of differences between the operation thresholds and set reference voltages in the plurality of pairs corresponding to the a-th comparator when n is larger than 1 in S4.

When n is larger than 2 in S4, the correction function in S6 may be obtained by spline fit or spline interpolation on the operation thresholds and set reference voltages in the plurality of pairs corresponding to the comparator, which are obtained in S4, to obtain a relation between an actual-operation threshold and an actual set reference voltage.

when n is larger than 2 in S4, the correction function in S6 may be obtained by linear interpolation on the operation thresholds and set reference voltages in the plurality of pairs corresponding to the comparator, which are obtained in S4, to obtain a relation between an actual-operation threshold and an actual set reference voltage.

In S7 the threshold correction function or a look-up table is used to configure, for each comparator, a corresponding reference voltage according to a threshold voltage to be set to the comparator.

The triangle wave in S1 may be replaced with a sine wave represented as:

$$y = k \times \sin\left(\frac{t}{T} \times 2\pi\right) + b; \ -0.25T < t < 0.75T;$$

when it is measured that the peak value of the sine wave is 2k, the period of the sine wave is T and the average voltage is b, the DOT where the sine wave is higher than the voltage Vt may be represented as:

$$DOT(Vt) = \frac{\frac{\pi}{2} - \sin^{-1}\left[\frac{Vt-b}{k}\right]}{\pi} \times T.$$

The triangle waveform in S1 may be replaced with any waveform that has a voltage value at time t represented as the following definite mathematical expression:

$$\begin{cases} y = f(t); \ t > t0 \\ y = Vpeak; \ t = t0 \\ y = g(t); \ t < t0 \end{cases}$$

where t0 is the time corresponding to the peak voltage Vpeak in the waveform, and the DOT corresponding to the voltage Vt may be represented as:

$$DOT(Vt)=g^{-1}(Vt)-f^{-1}(Vt).$$

The triangle waveform in S1 may be replaced with any waveform, and the relation between Vt and DOT of the waveform may be obtained by measuring DOTs of the pulse under a plurality of voltages and then establishing a look-up table.

The method according to the present disclosure will be described below in conjunction with specific embodiments.

Embodiment 1

Triangle Wave

In step S11, a triangle wave is generated by any waveform generator. Specifically, the slope of a rising edge of the triangle wave is k1=10 mV/ns, the slope of a falling edge of the triangle wave is k2=−10 mV/ns and the peak amplitude of the triangle wave is 500 mV. Then DOT of the waveform may be represented as:

$$DOT(Vt) = \frac{Vpeak - Vt}{k1} - \frac{Vpeak - Vt}{k2} = \frac{500 - Vt}{10} - \frac{500 - Vt}{-10} = 100 - \frac{Vt}{5}.$$

In step S12, the triangle wave is sampled by the multi-voltage threshold sampling digitization device repeatedly for 100 times, with the reference voltages of comparators 1, 2, 3 and 4 set as 40 mV. 8 sampling points can be obtained from one sampling, and each comparator corresponds to 2 sampling points, one being on a rising edge of the pulse and the other being on a falling edge of the pulse. For description convenience, the sampling time point obtained on the rising edge by comparator i in the n-th sampling is recorded as Tr(n,i), and the sampling time point obtained on the falling edge by comparator i in the n-th sampling is recorded as Tf(n,i).

In step S13, for comparator i, when the reference voltage is set as 40 mV, the corresponding DOT can be represented as:

$$\sum_{n=1}^{100} (Tf(n, i) - Tr(n, i))/100.$$

Actual results from measurement are shown in the following table 1:

TABLE 1

|  | Comparator 1 | Comparator 2 | Comparator 3 | Comparator 4 |
| --- | --- | --- | --- | --- |
| Reference voltage | 40 mV | 40 mV | 40 mV | 40 mV |
| DOT | 95.2 ns | 93.2 ns | 96.6 ns | 88.6 ns |
| Actual-operation threshold | 24 mV | 34 mV | 17 mV | 57 mV |

As shown in the above table, the actual-operation threshold of each of the 4 comparators can be calculated based on the formula given in S11.

In step S14, the reference voltages of the comparators 1, 2, 3 and 4 are set as 200 mV, and steps S12 and S13 are repeated, to obtain the measured DOTs of the comparators under the reference voltages as well as the corresponding actual-operation thresholds. The results are shown in Table 2.

TABLE 2

|  | Comparator 1 | Comparator 2 | Comparator 3 | Comparator 4 |
|---|---|---|---|---|
| Reference voltage | 200 mV | 200 mV | 200 mV | 200 mV |
| DOT | 63.2 ns | 61.2 ns | 64.6 ns | 56.6 ns |
| Actual-operation threshold | 184 mV | 194 mV | 177 mV | 217 mV |

In step S15, the reference voltages and actual-operation thresholds of the comparators are shown in the following table 3.

TABLE 3

|  | Comparator 1 | | Comparator 2 | | Comparator 3 | | Comparator 4 | |
|---|---|---|---|---|---|---|---|---|
| Reference voltage | 200 mV | 40 mV | 200 mV | 40 mV | 200 mV | 40 mV | 200 mV | 40 mV |
| Operation threshold | 184 mV | 24 mV | 194 mV | 34 mV | 177 mV | 17 mV | 217 mV | 57 mV |

In step S16, a function relation between the reference voltages and the operation thresholds is obtained by linear fit on the data obtained in S15 as follows:

$$y(a,i)=k(a)\times x(a,i)+\text{offset}(a),$$

where k(1), k(2), k(3) and k(4) all are 1, and offset(1), offset(2), offset(3) and offset(4) are 16 mV, 6 mV, 23 mV and −17 mV, respectively.

In step S17, when the reference voltages of comparators 1, 2, 3 and 4 in the multi-voltage threshold sampling digitization device are set as 40 mV, 80 mV, 120 mV and 160 mV respectively, according to the formula in S16 the actual-operation voltage thresholds of the multi-voltage threshold sampling digitization device can be learned to be 24 mV, 74 mV, 97 mV and 177 mV respectively.

Embodiment 2

Sawtooth Wave (Sawtooth Wave is a Special Triangle Wave)

In step S21, a sawtooth wave is generated by any waveform generator. Specifically, the slope of a rising edge of the sawtooth wave is k1=1 mV/ns, the slope of a falling edge of the sawtooth wave is k2=−500 mV/ns, and the peak amplitude of the sawtooth wave is 200 mV. Then DOT of the waveform may be represented as:

$$DOT(Vt) = \frac{Vpeak - Vt}{k1} - \frac{Vpeak - Vt}{k2} = \frac{200 - Vt}{1} - \frac{200 - Vt}{-500} = 200.4 - 1.0 \times Vt.$$

In step S22, the triangle wave is sampled with the multi-voltage threshold sampling digitization device repeatedly for 100 times, with the reference voltages of comparators 1, 2, 3 and 4 set as 40 mV. 8 sampling points can be obtained from one sampling, and each comparator corresponds to 2 sampling points, one being on a rising edge of the pulse and the other being on a falling edge of the pulse. For description convenience, the sampling time point obtained on the rising edge by comparator i in the n-th sampling is recorded as Tr(n,i), and the sampling time point obtained on the falling edge by the comparator i in the n-th sampling is recorded as Tf(n,i), In step S23, for comparator i, when the reference voltage is set as 40 mV, the corresponding DOT can be represented as:

$$\sum_{n=1}^{100}(Tf(n,i) - Tr(n,i))/100.$$

Actual results from measurement are shown in the following table 4:

TABLE 4

|  | Comparator 1 | Comparator 2 | Comparator 3 | Comparator 4 |
|---|---|---|---|---|
| Reference voltage | 40 mV | 40 mV | 40 mV | 40 mV |
| DOT | 176.2 ns | 166.1 ns | 183.4 ns | 143.6 ns |
| Actual-operation threshold | 24.2 mV | 34.3 mV | 17.0 mV | 56.8 mV |

As shown in the above table, the actual-operation threshold of each of the 4 comparators can be calculated based on the formula given in S21.

In step S24, the reference voltages of the comparators 1, 2, 3 and 4 are set as 200 mV and steps S22 and S23 are repeated, to obtain the measured DOTs of the comparators under the reference voltages as well as the corresponding actual-operation thresholds. The results are shown in Table 5:

TABLE 5

|  | Comparator 1 | Comparator 2 | Comparator 3 | Comparator 4 |
|---|---|---|---|---|
| Reference voltage | 140 mV | 140 mV | 140 mV | 140 mV |
| DOT | 76.8 ns | 67.2 ns | 83.3 ns | 43.1 ns |
| Actual-operation threshold | 123.6 mV | 133.2 mV | 117.1 mV | 157.3 mV |

In step S25, the reference voltages and actual-operation thresholds of the comparators are shown in the following table 6:

TABLE 6

|  | Comparator 1 | | Comparator 2 | | Comparator 3 | | Comparator 4 | |
| --- | --- | --- | --- | --- | --- | --- | --- | --- |
| Reference voltage | 140 mV | 40 mV | 140 mV | 40 mV | 140 mV | 40 mV | 140 mV | 40 mV |
| Operation threshold | 123.6 mV | 24.2 mV | 134.2 mV | 34.3 mV | 117.1 mV | 17.0 mV | 157.3 mV | 56.8 mV |

In step S26, a function relation between the reference voltages and the operation thresholds is obtained by linear fit on the data obtained in S25 as follows:

$$y(a,i) = k(a) \times x(a,i) + \text{offset}(a),$$

where k(1), k(2), k(3) and k(4) all are 1, and offset(1), offset(2), offset(3) and offset(4) are 16 mV, 6 mV, 23 mV and −17 mV respectively.

In step S27, when the reference voltages of comparators 1, 2, 3 and 4 in the multi-voltage threshold sampling digitization device are set as 40 mV, 80 mV, 120 mV and 160 mV respectively, according to the formula in S26 the actual-operation voltage thresholds of the multi-voltage threshold sampling digitization device can be learned to be 24 mV, 74 mV, 97 mV and 177 mV respectively.

Embodiment 3

Sine Wave

In step S31, a sine wave is generated by any waveform generator. Specifically, the period of the sine wave T=200 ns, the average voltage of the sine wave b=200 mV and the peak-peak value is 400 mV, i.e., k=200 mV. Then DOT of the waveform may be represented as:

$$DOT(Vt) = \frac{\frac{\pi}{2} - \sin^{-1}\left[\frac{Vt-b}{k}\right]}{\pi} \times T = \frac{\frac{\pi}{2} - \sin^{-1}\left[\frac{Vt-200}{200}\right]}{\pi} \times 200.$$

In step S32, the triangle wave is sampled with the multi-voltage threshold sampling digitization device repeatedly for 100 times, with the reference voltages of comparators 1, 2, 3 and 4 set as 40 mV. 8 sampling points can be obtained from one sampling, and each comparator corresponds to 2 sampling points, one being on a rising edge of the pulse and the other being on a falling edge of the pulse. For description convenience, the sampling time point obtained on the rising edge by comparator i in the n-th sampling is recorded as Tr(n,i), and the sampling time point obtained on the falling edge by comparator i in the n-th sampling is recorded as Tf(n,i).

In step S33, for comparator i, when the reference voltage is set as 40 mV, the corresponding DOT can be represented as:

$$\sum_{n=1}^{100} (Tf(n,i) - Tr(n,i))/100.$$

Actual results from measurement are shown in the following table 7;

TABLE 7

|  | Comparator 1 | Comparator 2 | Comparator 3 | Comparator 4 |
| --- | --- | --- | --- | --- |
| Reference voltage | 40 mV | 40 mV | 40 mV | 40 mV |
| DOT | 168.6 ns | 162.4 ns | 173.6 ns | 150.7 ns |
| Actual-operation threshold | 23.9 mV | 33.8 mV | 16.9 mV | 57.0 mV |

As shown in the above table, the actual-operation thresholds of the 4 comparators can be calculated based on the formula given in S31.

In step S34, the reference voltages of the comparators 1, 2, 3 and 4 are set as 200 mV and steps S32 and S33 are repeated, to obtain the measured DOTs of the comparators under the reference voltages as well as the corresponding actual-operation thresholds. The results are shown in Table 8;

TABLE 8

|  | Comparator 1 | Comparator 2 | Comparator 3 | Comparator 4 |
| --- | --- | --- | --- | --- |
| Reference voltage | 140 mV | 140 mV | 140 mV | 140 mV |
| DOT | 124.8 mV | 121.3 mV | 127.2 mV | 113.8 mV |
| Actual-operation threshold | 124.0 mV | 134.2 mV | 117.0 mV | 157.1 mV |

In step S35, the reference voltages and actual-operation thresholds of the comparators are shown in the following table 9;

TABLE 9

|  | Comparator 1 | | Comparator 2 | | Comparator 3 | | Comparator 4 | |
| --- | --- | --- | --- | --- | --- | --- | --- | --- |
| Reference voltage | 140 mV | 40 mV | 140 mV | 40 mV | 140 mV | 40 mV | 140 mV | 40 mV |
| Operation threshold | 124 mV | 23.9 mV | 134.2 mV | 33.8 mV | 117.0 mV | 16.9 mV | 157.1 mV | 57.0 mV |

In step S36, a function relation between the reference voltages and the operation thresholds is obtained by linear fit on the data obtained in S35:

$$y(a,i)=k(a)\times x(a,i)+\text{offset}(a),$$

where k(1), k(2), k(3) and k(4) all are 1, and offset(1), offset(2), offset(3) and offset(4) are 16 mV, 6 mV, 23 mV and −17 mV respectively.

In step S37, when the reference voltages of comparators 1, 2, 3 and 4 in the multi-voltage threshold sampling digitization device are set as 40 mV, 80 mV, 120 mV and 160 mV respectively, according to the formula in S36 the actual-operation voltage thresholds of the multi-voltage threshold sampling digitization device can be learned to be 24 mV, 74 mV, 97 mV and 177 mV respectively.

The method for correcting a threshold of a multi-voltage threshold sampling digitization device according to the present disclosure can effectively solve the problem of sampling precision deterioration due to the inconsistency between the reference voltage actually set in the comparator under actual-operation status and the actual-operation status threshold. By using the method, it is no longer needed to use a high-precision comparator in the MVT device, effectively reducing the cost of the MVT device. Moreover, due to the decrease of comparator precision, power consumption of the device as a whole can be improved effectively and high-density integration is permitted.

The method for correcting a threshold of a multi-voltage threshold sampling digitization device according to the present disclosure acquires the relation between a threshold set to the comparator and an actual-operation threshold for threshold correction, thereby avoiding the use of a high-precision comparator in the a high-precision MVT device. The correction function is obtained from a relation between the actual threshold and DOT, the width of a portion of the pulse that is higher than the actual-operation threshold, of a special waveform such as a triangle wave.

Preferred embodiments of the present disclosure are described above, which shall not be interpreted as limiting the present disclosure to any form. Numerous alternations, modifications, and equivalents can be made to the technical solutions of the present disclosure by those skilled in the art in light of the methods and technical content disclosed herein without deviation from the scope of the present disclosure. Therefore, any alternations, modifications, and equivalents made to the embodiments above according to the technical essential of the present disclosure without deviation from the scope of the present disclosure should fall within the scope of protection of the present disclosure.

What is claimed is:

1. A method for correcting a threshold of a multi-voltage threshold sampling digitization device, comprising:
    S1: generating a triangle wave for correcting a threshold of a multi-voltage threshold sampling digitization device, measuring k1, k2 and Vpeak of the waveform of the triangle wave, and representing a DOT of the waveform of the triangle wave as:

$$DOT(Vt) = \frac{Vpeak - Vt}{k1} - \frac{Vpeak - Vt}{k2},$$

where k1 is the slope of a rising edge of the waveform of the triangle wave, k2 is the slope of a falling edge of the waveform of the triangle wave, Vpeak is the peak amplitude of the waveform of the triangle wave, Vt is an actual-operation threshold, and DOT(Vt) is the width of a portion of the pulse that is higher than the actual-operation threshold;
    S2: configuring a reference voltage for each comparator in the multi-voltage threshold sampling digitization device, and acquiring sampling points of the pulse of S1 by digitization sampling the pulse with the digitization device;
    S3: calculating a DOT for each comparator under its set reference voltage based on the sampling points obtained in S2, calculating an actual-operation threshold for each comparator based on the formula given in S1, and establishing a set of correspondence between each calculated actual-operation threshold and the set reference voltage;
    S4: reconfiguring the reference voltage for each comparator in the digitization device and repeating S2 and S3 for m times, to obtain, for each comparator in the multi-voltage threshold sampling digitization device, n sets of correspondence between actual-operation thresholds and set reference voltages, where n is a positive integer larger than or equal to 1 and m is a positive integer larger than or equal to 0;
    S5: dividing the actual-operation thresholds and their corresponding set reference voltages obtained in S4 into k groups according to the associated comparator, where k is a positive integer and represents the number of comparators in the multi-voltage threshold sampling digitization device;
    S6: obtaining, by linear fit, a function relation between the actual-operation thresholds and the set reference voltages for each group of data:

$$y(a,i)=k(a)\times x(a,i)+\text{offset}(a),$$

where y(a,i) represents the actual-operation threshold in the i-th pair corresponding to the a-th comparator in the multi-voltage threshold sampling digitization device, x(a,i) represents the set reference voltage in the i-th pair corresponding to the a-th comparator in the multi-voltage threshold sampling digitization device, and k(a) and offset(a) represent coefficients obtained from the linear fit on the actual-operation thresholds and set reference voltages in the group of data corresponding to the a-th comparator; and
    S7: obtaining an actual threshold voltage for each comparator under a set reference voltage based on the threshold correction function obtained in S6, and achieving threshold correction.

2. The method for correcting a threshold of a multi-voltage threshold sampling digitization device according to claim 1, wherein:
    the DOT in S3 is calculated by: taking two sampling points that are obtained via the same comparator from the acquired sampling points of the pulse, and calculating the time interval between the two sampling points, the value of the time interval being the DOT of the comparator under an actual-operation threshold voltage corresponding to the set reference voltage of the comparator in this sampling.

3. The method for correcting a threshold of a multi-voltage threshold sampling digitization device according to claim 1, wherein:
    the DOT in S3 is the average of the DOTs obtained from a plurality of times of measurement under the same condition.

4. The method for correcting a threshold of a multi-voltage threshold sampling digitization device according to claim 1, wherein:

the threshold correction function in S6 has another expression:

$y(a,i)=x(a,i)+\text{offset}(a)$, where offset(a) is the difference between the operation threshold and the set reference voltage corresponding to the a-th comparator when n is equal to 1 in S4; and offset(a) is the average of differences between the operation thresholds and set reference voltages in the plurality of pairs corresponding to the a-th comparator when n is larger than 1 in S4.

5. The method for correcting a threshold of a multi-voltage threshold sampling digitization device according to claim 1, wherein:

when n is larger than 2 in S4, the correction function in S6 is obtained by spline fit or spline interpolation on the operation thresholds and set reference voltages in the plurality of pairs corresponding to the comparator, which are obtained in S4, to obtain a relation between an actual-operation threshold and an actual set reference voltage.

6. The method for correcting a threshold of a multi-voltage threshold sampling digitization device according to claim 1, wherein:

when n is larger than 2 in S4, the correction function in S6 is obtained by linear interpolation on the operation thresholds and set reference voltages in the plurality of pairs corresponding to the comparator, which are obtained in S4, to obtain a relation between an actual-operation threshold and an actual set reference voltage.

7. The method for correcting a threshold of a multi-voltage threshold sampling digitization device according to claim 1, wherein:

in S7 the threshold correction function or a look-up table is used to configure, for each comparator, a corresponding reference voltage according to a threshold voltage to be set to the comparator.

8. The method for correcting a threshold of a multi-voltage threshold sampling digitization device according to claim 1, wherein:

the triangle wave in S1 is replaced with a sine wave represented as:

$$y = k \times \sin\left(\frac{t}{T} \times 2\pi\right) + b;\ -0.25T < t < 0.75T.$$

when it is measured that the peak value of the sine wave is 2k, the period of the sine wave is T and the average voltage is b, the DOT where the sine wave is higher than the voltage Vt is represented as:

$$DOT(Vt) = \frac{\frac{\pi}{2} - \sin^{-1}\left[\frac{Vt-b}{k}\right]}{\pi} \times T.$$

* * * * *